United States Patent [19]

Fujita

[11] Patent Number: 4,987,323
[45] Date of Patent: Jan. 22, 1991

[54] PEAK VOLTAGE HOLDING CIRCUIT
[75] Inventor: Tsuneo Fujita, Tokyo, Japan
[73] Assignee: NEC Corporation, Japan
[21] Appl. No.: 385,818
[22] Filed: Jul. 27, 1989
[30] Foreign Application Priority Data Aug. 8, 1988 [JP] Japan .................................. 63-198310

[51] Int. Cl.⁵ ........................ H03K 5/00; H03K 5/153
[52] U.S. Cl. .................................... 307/351; 307/246; 307/353
[58] Field of Search ........................ 307/351, 353, 246

[56] References Cited

U.S. PATENT DOCUMENTS 4,400,633 8/1983 Mouri .................................. 307/351

FOREIGN PATENT DOCUMENTS 0216063 12/1984 Japan .................................... 307/351

OTHER PUBLICATIONS

R. E. Penny, Dynamic Threshold Setting Circuit, IBM Technical Disclosure Bulletin, vol. 18, No. 6, Nov. 1975, pp. 1962–1965.
Handbook of Integrated Circuits: For Engineers and Technicians by John D. Lenk.
Circuit Design for Electronic Instrumentation by Darold Wobschall.

Primary Examiner—John Zazworsky
Attorney, Agent, or Firm—Laff, Whitesel, Conte & Saret

[57] ABSTRACT

In a peak voltage holding circuit, a leakage circuit includes a first-stage mirror circuit, a second-stage mirror circuit, a selecting circuit, a capacitor, and a control circuit. The first-stage mirror circuit has one end connected to a second potential. The second-stage mirror circuit has one end connected to the output side of an input circuit and the other end connected to a first potential, and causes a current corresponding to a current which flows through the first-stage mirror circuit connected to the first potential to flow out from the voltage holding capacitor. The selecting circuit is connected the other end of the first-stage mirror circuit. The capacitor has one end connected to the selecting circuit and the other end connected to the first potential. The control circuit is connected to the selecting circuit and controls an operation of the selecting circuit. The selecting circuit alternately connects one end of the capacitor to the other end of the first-stage mirror circuit and the first potential at every arbitrary period.

5 Claims, 4 Drawing Sheets

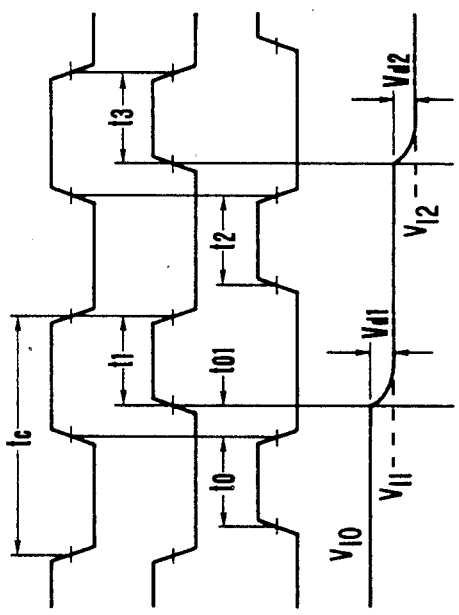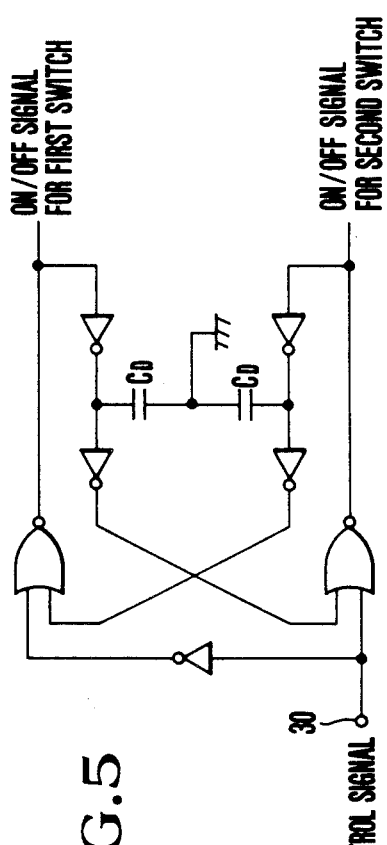
FIG. 4(A) CONTROL SIGNAL
FIG. 4(B) ON/OFF SIGNAL FOR FIRST SWITCH
FIG. 4(C) ON/OFF SIGNAL FOR SECOND SWITCH
FIG. 4(D) HOLD OUTPUT VOLTAGE
FIG. 5

“PEAK VOLTAGE HOLDING CIRCUIT

BACKGROUND OF THE INVENTION

The present invention relates to a peak voltage holding circuit and, more particularly, to a peak voltage holding circuit having holding characteristics with leakage characteristics obtained by a capacitor.

As a conventional peak voltage holding circuit, a circuit using a capacitor and an amplifier is available. In this circuit, an analog input voltage is applied to the capacitor through the amplifier having a rectifying function. If the analog input voltage is lower than a voltage held by the capacitor, the circuit is not rendered conductive because of the rectifying effect of the amplifier, and the capacitor keeps holding the previous voltage. In contrast to this, if the analog input voltage is higher than a voltage held by the capacitor, the circuit is rendered conductive because of the rectifying effect of the amplifier so as to charge the capacitor up to the level of the analog input voltage. With this operation, the peak value of the applied analog input voltages is held by the capacitor.

FIG. 1 is a circuit diagram showing a conventional peak voltage holding circuit using a capacitor and an amplifier.

Referring to FIG. 1, reference numeral 11 denotes a voltage holding capacitor; 13 and 14, amplifiers; 15 and 16, rectifiers; 10, an input terminal for an analog input voltage $V_X$; and 20, an output terminal for a peak voltage $V_P$. The amplifiers 13 and 14 respectively constitute noninverting amplifying circuits each having a unitary gain. The output of the amplifier 14 is also connected to the inverting input terminal of the amplifier 13.

An operation of the conventional circuit shown in FIG. 1 will be described below. When the analog input voltage $V_X$ is applied to the input terminal 10, an output voltage $V_2$ from the amplifier 13 becomes equal to the voltage $V_X$. At this time, if the value of the output voltage $V_2$ from the amplifier 13 is larger than that of a voltage $V_1$ held by the voltage holding capacitor 11, the rectifier 16 is turned on to further charge the capacitor 11. In this case, since the capacitor 11 is charged through the rectifier 16, the capacitor 11 is charged to increase the voltage $V_1$ by only a value obtained by subtracting a threshold voltage $V_T$ from the output voltage $V_2$, i.e., $V_2-V_T$.

In addition, since the output voltage $V_2$ from the amplifier 13 is equal to the analog input voltage $V_X$, and an output voltage $V_P$ from the amplifier 14 is equal to the voltage $V_1$ held by the voltage holding capacitor 11, the output voltage $V_P$ from the amplifier 14 is equal to $V_X-V_T$.

An output from the amplifier 14 is fed back to the inverting input terminal of the amplifier 13. Therefore, a voltage to be applied to the inverting input terminal 13 is the output voltage $V_P$ from the amplifier 14, i.e., the voltage $V_X-V_T$. Since the analog input voltage $V_X$ is a voltage which is applied to the noninverting input terminal of the amplifier 13, the voltages applied to the noninverting and inverting input terminals of the amplifier 13 becomes unbalanced. The difference between the applied voltages is equal to the voltage $V_T$. As a result, an output voltage from the amplifier 13 is changed due to the difference between the voltages applied to its noninverting and inverting input terminals. The change in output voltage from the amplifier 13 is fed back to the noninverting input terminal of the amplifier 13 through the amplifier 14. When a voltage applied to the noninverting input terminal of the amplifier 13 becomes equal to the analog input voltage $V_X$, a balanced state is obtained and the change in output voltage from the amplifier 13 is stopped. Finally, the value of the output voltage $V_2$ from the amplifier 13 becomes equal to $V_X+V_T$, and the voltage $V_1$ held by the voltage holding capacitor 11 reaches the level of the voltage $V_2$ to be equal to the analog input voltage. Therefore, if the peak value of the analog input voltage $V_X$ is a value $V_{XP}$, the voltage $V_1$ held by the capacitor 11 increases to the value $V_{XP}$, and at the same time the output voltage $V_P$ from the amplifier 14 increases to the value $V_{XP}$. At this time, the output voltage $V_2$ from the amplifier 13 becomes a voltage $V_{XP}+V_T$ due to the feedback effect from the amplifier 14 described above.

When the analog input voltage $V_X$ becomes smaller than the peak value $V_{XP}$, an output voltage from the amplifier 13 becomes smaller than the voltage $V_{XP}+V_T$, and the rectifier 16 is reverse-biased to be nonconductive. Therefore, the change in input voltage is not transmitted to the voltage holding capacitor 11, and the capacitor 11 keeps holding the peak value $V_{XP}$ of the analog input voltage $V_X$. Note that the rectifier 15 clamps an output from the amplifier 13 so as to prevent an output from the amplifier 13 from shifting to the negative side when the analog input voltage $V_X$ becomes negative.

When leakage characteristics are to be added to the holding characteristics of the above-described conventional peak voltage holding circuit, a resistor is connected in parallel with the voltage holding capacitor 11 so that charge accumulated in the capacitor 11 can be gradually discharged.

FIG. 2 shows such a leakage circuit. Referring to FIG. 2, reference numeral 21 denotes a resistor for constituting a leakage path of charge stored in the voltage holding capacitor 11; and 16, a diode for preventing reverse flow of charge, which is equivalent to the diode as the rectifier 16 in FIG. 1.

The resistance of the resistor 21 is determined such that a leakage time constant defined by the resistor 21 and the voltage holding capacitor 11 satisfies necessary leakage characteristics. The resistor 21 normally has a high resistance of $10^6$ Ω or more.

If, however, a peak voltage holding circuit having such a leakage circuit is to be formed into a monolithic IC, arrangement of a resistive element having a high resistance requires a special process, and the area of the circuit is increased. It is difficult to maintain the resistance of such a high-resistance resistor to be constant in terms of manufacture. For this reason, variation in leakage characteristics of products tends to occur. Therefore, such a leakage circuit is very difficult to design.

SUMMARY OF THE INVENTION

It is, therefore, a principal object of the present invention to provide a peak voltage holding circuit having leakage characteristic which requires no resistor having a high resistance and allows a great deal of freedom in design.

In order to achieve the above object, according to an embodiment of the present invention, there is provided a peak voltage holding circuit having input means for inputting an analog voltage, a voltage holding capacitor, having one end connected to an output side of the input means and the other end connected to a first potential, for holding a peak value of the analog voltage, leakage means, connected in parallel with the voltage holding capacitor, for gradually leaking the analog voltage held by the voltage holding capacitor, and output means, connected to the output side of the input means, for outputting the peak value of the analog voltage held by the voltage holding capacitor, wherein the leakage means comprises, a first-stage mirror circuit having one end connected to a second potential and having another end, a second-stage mirror circuit, having one end connected to the output side of the input means and the other end connected to the first potential, for causing a current corresponding to a current which flows through the first-stage mirror circuit to flow out from the voltage holding capacitor, a selecting circuit (selector) connected to the other end of the first-stage mirror circuit, a capacitor having one end connected to the selecting circuit and the other end connected to the first potential, and a control circuit, connected to the selecting circuit, for controlling an operation of the selecting circuit, the selecting circuit alternately connecting one end of the capacitor to the other end of the first-stage mirror circuit and the first potential at every arbitrary period.

BRIEF DESCRIPTION OF THE DRAWINGS

FIGS. 4(A) to 4(D) are timing charts showing an ON/OFF timing of a switch;

FIG. 5 is a circuit diagram showing a control circuit for controlling an ON/OFF operation of the switch.

DETAILED DESCRIPTION OF THE PREFERRED EMBODIMENTS

Figure 3:
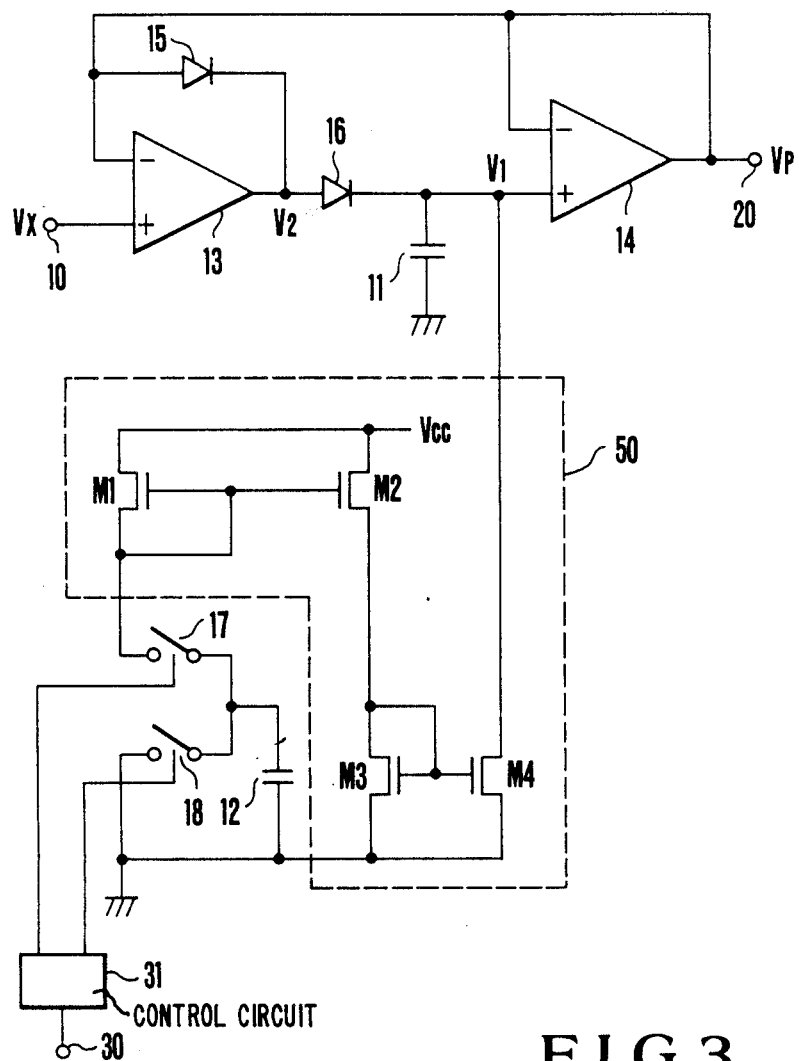
FIG. 3 is a circuit diagram showing an arrangement of a peak voltage holding circuit according to the present invention.

FIG. 3 shows a peak voltage holding circuit according to the present invention. The same reference numerals in FIG. 3 denote the same parts as in FIG. 1. An amplifier 13 constitutes a noninverting amplifying circuit (input means) having a unitary gain. In addition, an amplifier 14 constitutes a noninverting amplifying circuit (output means) having a unitary gain. The output terminal of the amplifier 14 is connected to the noninverting input terminal of the amplifier 13.

Reference numeral 12 denotes a leakage capacitor for determining leakage characteristics; 17 and 18, first and second switches (selecting circuit) which are ON/OFF-controlled by a control circuit 31; and 50, a current mirror circuit consisting of transistors M1 and M2 (first mirror circuit) and transistors M3 and M4 (second mirror circuit).

Note that reference numeral 30 denotes an input terminal for a control signal; and reference symbol $V_{CC}$, a source voltage (second potential). One end of each of a voltage holding capacitor 11, the mirror circuit 50, and the leakage capacitor 12 is connected to ground (first potential).

FIGS. 4(A) to 4(D) are timing charts respectively showing respective control signals for controlling a leakage operation of the peak voltage holding circuit according to the present invention. FIG. 4(A) shows a control signal: FIG. 4(B), an ON/OFF signal for a first switch; FIG. 4(C), an ON/OFF signal for a second switch; and FIG. 4(D), a waveform of a hold output voltage $V_P$.

Figure 1:
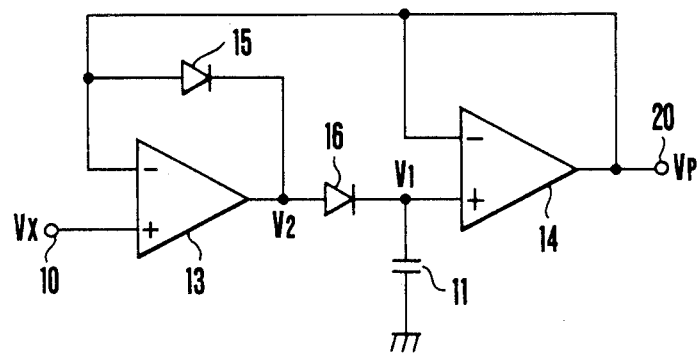
FIG. 1 is a circuit diagram showing an arrangement of a conventional peak voltage holding circuit.
Figure 2:
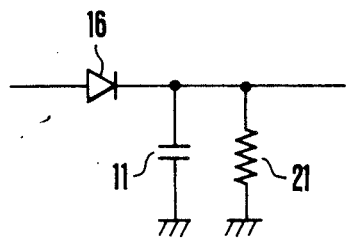
FIG. 2 is a circuit diagram showing a conventional leakage circuit.

A peak voltage holding operation of the circuit of the present invention is basically the same as the conventional circuit shown in FIG. 1. Unlike the conventional circuit, however, the circuit of the present invention comprises a leakage circuit constituted by a current mirror circuit, a capacitor, and a switch. A leakage operation will be described below with reference to FIGS. 3 and 4. The initial value of a voltage held by the voltage holding capacitor shown in FIG. 3 is set to be a value V10, and the second switch 18 is closed during an interval $t_0$ to discharge all the charge stored in the leakage capacitor 12. During an interval $t_1$, the second switch 18 is then kept open and at the same time the first switch 17 is closed. With this operation, the leakage capacitor 12 is charged through the transistor M1 constituting the current mirror circuit 50. In this case, since the transistors M1 and M2 have a common gate, a current $i_2$ corresponding to a charge current $i_1$ which flows through the transistor M1 is supplied to the transistor M2. The current $i_2$ which flows through the transistor M2 is supplied to the transistor M3, and hence a current $i_3$ corresponding to the current $i_2$ which flows through the transistors M2 and M3 is supplied to the transistor M4 whose gate is common to that of the transistor M3.

If a gate length (L) and a gate width (W) of the transistor M1 are respectively represented by $L_1$ and $W_1$, and those of the transistor M2 are respectively represented by $L_2$ and $W_2$, equation (1) is established as follows:

$$\frac{i_2}{i_1} = \frac{W_2/L_2}{W_1/L_1} \tag{1}$$

In this case, if $L_1 = L_2$ and $K_1 W_1 = W_2$, the relationship between the currents $i_1$ and $i_2$ can be represented by equation (2):

$$\frac{i_2}{i_1} = \frac{K_1 W_1/L_1}{W_1/L_1} = K_1 \tag{2}$$

Similarly, assume that the values L and W of the transistor M3 are respectively represented by $L_3$ and $W_3$; and the values L and W of the transistor M4, $L_4$ and $W_4$. In this case, if $L_3 = L_4 = L_1$ and $K_2 W_3 = W_4$, the relationship between the currents $i_2$ and $i_3$ can be represented by equation (3) as follows:

$$\frac{i_3}{i_2} = \frac{W_4/L_4}{W_3/L_3} = \frac{K_2 W_3/L_4}{W_3/L_4} = K_2 \tag{3}$$

The relationship between the currents $i_1$ and $i_3$ is then represented by equation (4) according to equations (2) and (3) as follows:

$$\frac{i_3}{i_1} = K_1 \cdot K_2 \tag{4}$$

In this manner, the charge current $i_1$ which flows through the transistors M1 and the current $i_3$ which flows through the transistor M4 are determined by a ratio of the gate widths (W) of the transistors constituting the current mirror circuit.

If the capacitance of the leakage capacitor 12 and the threshold voltage of the transistor M1 are respectively represented by $C_{12}$ and $V_{T1}$, charge $Q_{12}$ stored in the leakage capacitor 12 by the charge current $i_1$ which flows through the transistor M1 is represented by equation (5):

$$Q_{12} = C_{12}(V_{CC} - V_{T1}) \qquad (5)$$

Therefore, charge $Q_L$ which flows out from the current holding capacitor 11 as the current $i_3$ which flows in the transistor M4 can be represented by equation (6) according to equations (4) and (5) as follows:

$$Q_L = K_1 \cdot K_2 \cdot C_{12}(V_{CC} - V_{T1}) \qquad (6)$$

If the capacitance of the voltage holding capacitor 11 is represented by $C_{11}$, a change amount $V_{d1}$ of a voltage held by the voltage holding capacitor 11 at this time is represented by equation (7) according to equation (6) as follows:

$$V_{d1} = \frac{K_1 \cdot K_2 \cdot C_{12}(V_{CC} - V_T)}{C_{11}} \qquad (7)$$

Therefore, the value of the voltage held by the capacitor 11 is decreased by the value $V_{d1}$, and a value $V_{11}$ of the voltage at this time is represented by equation (8):

$$\begin{aligned} V_{11} &= V_{10} - V_{d1} \\ &= V_{10} - \frac{K_1 \cdot K_2 \cdot C_{12}(V_{CC} - V_T)}{C_{11}} \end{aligned} \qquad (8)$$

During an interval $t_2$ shown in FIGS. 4(A) to 4(D), the first switch 17 is kept open and at the same time the second switch 18 is closed. As a result, all the charge $Q_{12}$ which was stored in the leakage capacitor 12 during the interval $t_1$ is discharged, and the amount of the charge stored in the leakage capacitor 12 becomes zero. Subsequently, during an interval $t_3$, the second switch 18 is kept open and at the same time the first switch 17 is closed. As a result, the leakage capacitor 12 is charged through the transistor M1 constituting the current mirror circuit 50, and the current $i_3$ corresponding to the current $i_1$ which flows through the transistor M1 is supplied to the transistor M4. That is, part of the charge stored in the voltage holding capacitor 11 flows out. At this time, a change amount $V_{d2}$ of the voltage held by the capacitor 11 can be represented by equation (9) in the following manner as in the previous operation period:

$$V_{d2} = \frac{K_1 \cdot K_2 \cdot C_{12}(V_{CC} - V_T)}{C_{11}} \qquad (9)$$

Therefore, the voltage held by the voltage holding capacitor 11 is further decreased, and a value $V_{12}$ of the voltage at this time can be represented by equation (10):

$$\begin{aligned} V_{12} &= V_{11} - V_{d2} \\ &= V_{10} - \frac{2 \cdot K_1 \cdot K_2 \cdot C_{12}(V_{CC} - V_T)}{C_{11}} \end{aligned} \qquad (10)$$

In this manner, the value of a voltage held by the voltage holding capacitor 11 is decreased at a constant rate determined by the capacitances $C_{11}$ and $C_{12}$ of the capacitors 11 and 12 and ratios $K_1$ and $K_2$ of the gate widths (W) of the transistor pairs constituting the current mirror circuit upon a single ON/OFF operation of the second and first switches 18 and 17.

The leakage characteristics of the peak voltage holding circuit are finally determined not only by the change amount $V_d$ of the voltage held by the voltage holding capacitor 11 upon a signal ON/OFF operation of the first and second switches 17 and 18 as described above but also by a period $t_c$ of ON/OFF operation of the first and second switches 17 and 18. Therefore, if the number of ON/OFF operations within a unit time is increased, the period $t_c$ can be shortened. As a result, a change in voltage held by the voltage holding capacitor can be increased, and an apparent leakage time constant can be reduced accordingly.

In contrast to this, if the number of ON/OFF operations of the first and second switches within a unit time is decreased, the period $t_c$ can be prolonged. As a result, a change in voltage held by the voltage holding circuit can be reduced, and an apparent leakage time constant can be increased. In addition, the output voltage $V_P$ from the peak voltage holding circuit is changed stepwise upon each ON/OFF operation of the first and second switches 17 and 18, as described above. However, if the capacitance $C_{12}$ of the leakage capacitor 12 is set to be smaller than that of the voltage holding capacitor 11, or the ratios $K_1$ and $K_2$ of the gate widths (W) of the transistor pairs constituting the current mirror circuit are set to be far smaller than 1, the change amount $V_d$ of the voltage held by the voltage holding capacitor can be reduced to a negligibly small value. As a result, the ON/OFF period $t_c$ of the first and second switches can be shortened. Therefore, even if the apparent time constant remains the same, leakage characteristics exhibiting a relatively moderate change in characteristics with a small change amount per single operation can be obtained.

An ON/OFF operation of the first and second switches 17 and 18 is performed at the timing shown in FIGS. 4(A) to 4(D). As shown in FIGS. 4(A) to 4(D), ON intervals $t_1$, $t_3$, ... of the first switch 17 and ON intervals $t_0$, $t_2$, ... of the second switch 18 must not coincide with each other. FIG. 5 shows a control circuit for generating control signals for such a purpose. Referring to FIG. 5, reference symbol $C_D$ denotes a capacitor for delaying interval signals.

Figure 6:
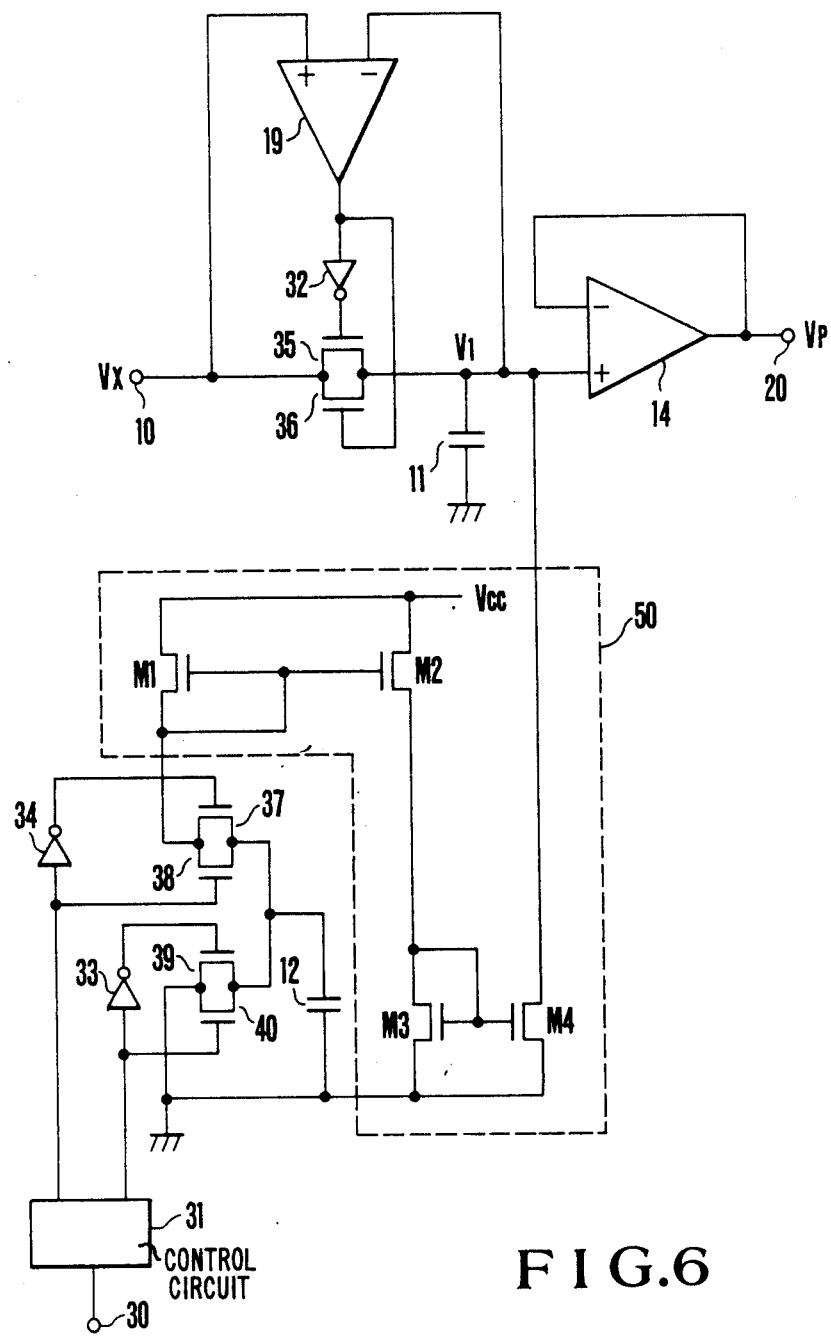
FIG. 6 is a circuit diagram showing an arrangement of a peak voltage holding circuit according to another embodiment of the present invention.

FIG. 6 shows a peak voltage holding circuit according to another embodiment of the present invention. The same reference numerals in FIG. 6 denote the same parts as in FIG. 3. Reference numeral 19 denotes a comparator; 32 to 34, inverters; 35, 37, and 39, p-type MOS transistors; and 36, 38, and 40, n-type MOS transistors. In this case, the transistors 35 and 36, 37 and 38, and 39 and 40 respectively constitute complementary type MOS switches. The switches constituted by the transistors 37 and 38 and the transistors 39 and 40 respectively correspond to the first and second switches 17 and 18 shown in FIG. 3. The mirror circuits formed by transistors $M_1$ to $M_4$ are comprised of CMOS transistors.

The peak voltage holding circuit shown in FIG. 6 is designed such that a switch is arranged between an analog input terminal 10 and a voltage holding capacitor 11. The comparator 19 compares an analog input voltage $V_X$ with a voltage $V_1$ held by the capacitor 11. An ON/OFF operation of the switch constituted by the p- and n-type MOS transistors 35 and 36 is controlled by an output from the comparator 19. With this arrangement, a peak value $V_{XP}$ of the analog input voltage $V_X$ can be held by the capacitor 11. Note that a leakage operation in this circuit is performed in the same manner as in the peak voltage holding circuit shown in FIG. 3.

As has been described above, according to the present invention, unlike the conventional peak voltage holding circuit, a leakage path using a high-resistance resistor need not be arranged, and a predetermined leakage time constant can be obtained by changing the ratio of the gate widths of each transistor pair constituting a current mirror circuit without greatly increasing the ratio of capacitance of a voltage holding capacitor to that of a leakage capacitor. Therefore, when the circuit is to be formed into a monolithic IC, leakage characteristics with excellent design precision can be obtained.

In addition, in the present invention, an apparent time constant can be changed by changing the ratio of the capacitance of the voltage holding capacitor to that of the leakage capacitor, or changing the ratios of the gate widths of each transistor pair constituting the current mirror circuit. Moreover, the apparent leakage time constant can be changed by changing the ON/OFF operation period of first and second switches, thus improving flexibility in design.

What is claimed is:

1. A peak voltage holding circuit having:
   input means for inputting an analog voltage said input means having an output side;
   a voltage holding capacitor, having one end connected to an output side of said input means and an other end connected to a first potential, for holding a peak value of the analog voltage;
   leakage means, connected in parallel with said voltage holding capacitor, for gradually leaking the analog voltage held by said voltage holding capacitor; and
   output means, connected to the output side of said input means, for outputting the peak value of the analog voltage held by said voltage holding capacitor, wherein
   said leakage means comprises:
   a first-stage mirror circuit having one end connected to a second potential and having another end;
   a second-stage mirror circuit, having one end connected to the output side of said input means and another end connected to the first potential, for causing a current corresponding to a current which flows through said first-stage mirror circuit to flow out from said voltage holding capacitor;
   a selecting circuit connected to the other end of said first-stage mirror circuit;
   a capacitor having one end connected to said selecting circuit and another end connected to the first potential; and
   a control circuit, connected to said selecting circuit, for controlling an operation of said selecting circuit,
   said selecting circuit alternately connecting one end of said capacitor to the other end of said first-stage mirror circuit and the first potential at every arbitrary period.

2. A circuit according to claim 1, wherein said selecting circuit comprises first and second switches each having control, first and second electrodes, and
   the control electrodes of said first and second switches being connected to said control circuit, the first electrode of said first switch being connected to the other end of said first-stage mirror circuit, the second electrodes of said first and second switches being connected in common to said one end of said capacitor.

3. A circuit according to claim 1, wherein said first and second mirror circuits comprise CMOS transistors.

4. A circuit according to claim 2, wherein said first and second switches comprise CMOS transistors.

5. A peak voltage holding circuit comprising:
   means, having a first capacitor, for detecting a peak level of an input signal and for causing said first capacitor to hold a voltage corresponding to the peak level;
   first and second current mirror circuits each having a current input terminal and a current output terminal;
   means for connecting said current output terminal of said first current mirror circuit to said first capacitor;
   means for connected said current output terminal of said second current mirror circuit to said current input terminal of said first current mirror circuit;
   a second capacitor having one end connected to a reference voltage point and having another end;
   first switching means connected between said other end of said second capacitor and said current input terminal of said second current mirror circuit;
   second switching means connected between said other end of said second capacitor and said reference voltage point; and
   control means for alternately operating said first and second switching means.

* * * * *